US006972955B2

(12) United States Patent
Pleskach et al.

(10) Patent No.: US 6,972,955 B2
(45) Date of Patent: Dec. 6, 2005

(54) ELECTRO-FLUIDIC DEVICE AND INTERCONNECT AND RELATED METHODS

(75) Inventors: Michael David Pleskach, Orlando, FL (US); Paul Bryant Koeneman, Palm Bay, FL (US); Brian Ronald Smith, Pittsburgh, PA (US); Charles Michael Newton, Palm Bay, FL (US); Carol Ann Gamlen, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 274 days.

(21) Appl. No.: 10/670,480

(22) Filed: Sep. 25, 2003

(65) Prior Publication Data

US 2005/0068726 A1    Mar. 31, 2005

(51) Int. Cl.[7] .......................... H05K 7/20; H25K 3/34; H01L 21/44
(52) U.S. Cl. ...................... 361/689; 361/688; 137/884; 422/100; 438/122
(58) Field of Search ............................... 361/688, 689, 361/698, 699; 137/487.5, 596.16, 560, 240, 137/594, 597, 833, 884; 257/414, 704, 712, 257/684; 422/58, 72, 100; 438/122, 622, 438/52, 55, 125, 128; 429/19; 436/45, 180; 285/124.1, 348; 53/396

(56) References Cited

U.S. PATENT DOCUMENTS

| | | | |
|---|---|---|---|
| 5,197,895 A | | 3/1993 | Stupecky .................... 439/194 |
| 5,348,047 A | * | 9/1994 | Stoll et al. .................. 137/554 |
| 5,640,995 A | | 6/1997 | Packard et al. ............. 137/597 |
| 5,740,594 A | | 4/1998 | Lukasiewicz et al. ...... 29/25.41 |
| 6,548,895 B1 | | 4/2003 | Benavides et al. .......... 257/712 |
| 6,772,513 B1 | * | 8/2004 | Frye-Mason et al. ......... 29/840 |
| 6,821,819 B1 | * | 11/2004 | Benavides et al. .......... 438/122 |

* cited by examiner

Primary Examiner—Michael Datskovskiy
(74) Attorney, Agent, or Firm—Allen, Dyer, Doppelt, Milbrath & Gilchrist, P.A.

(57) ABSTRACT

An electro-fluidic device may include a substrate having at least one substrate fluid passageway therein, and at least one substrate electrical conductor carried by the substrate. Moreover, an external interface may be spaced from the substrate and include at least one interface electrical conductor. The electro-fluidic device may also include at least one electro-fluidic interconnect extending between the substrate and the external interface. More particularly, the at least one electro-fluidic interconnect may include an interconnect body having at least one interconnect fluid passageway extending therethrough and connected to the at least one substrate fluid passageway, and at least one interconnect electrical conductor carried by the interconnect body. The at least one interconnect electrical conductor may connect the at least one substrate electrical conductor and the at least one interface electrical connector.

25 Claims, 5 Drawing Sheets

ELECTRO-FLUIDIC DEVICE AND INTERCONNECT AND RELATED METHODS

GOVERNMENT LICENSE RIGHTS

The U.S. Government has a paid-up license in this invention and the right in limited circumstances to require the patent owner to license others on reasonable terms as provided for by the terms of contract No. NBCHC010060, awarded by the Defense Advanced Research Projects Agency (DARPA).

FIELD OF THE INVENTION

The present invention relates to the field of electro-fluidic devices, and, more particularly, to electro-fluidic device packaging and related methods.

BACKGROUND OF THE INVENTION

Microsystems are becoming increasingly more prevalent in a variety of applications. For example, micro-electromechanical systems, or MEMS, are being used in numerous automotive, medical, and construction applications. Generally speaking, a MEMS combines a very small mechanical device, such as a valve, actuator, fluid sensor, pump, etc., with an integrated circuit (IC). The IC provides electronic control signals for the mechanical device, and both may be mounted on a common substrate.

In many applications, a MEMS device requires access to a fluid flow. For example, a MEMS including a value or fluid sensor may be used to control a fluid flow or measure a characteristic of the fluid, respectively. Also, a MEMS including a small motor, for example, may require access to a fuel source for the motor.

As device sizes continue to decrease with technological innovation, providing proper packaging for electro-fluidic microsystems can be challenging. In particular, providing the appropriate fluid and electrical interconnects for the device can be quite difficult due to space constraints. Moreover, these interconnections are complicated by the fact that fluid connections typically need to be hermetically sealed, and the electrical connections need to be adequately spaced apart to prevent signal shorting, etc.

Various approaches have been made in the prior art to address packaging issues in electro-fluidic microsystems. One example is set forth in U.S. Pat. No. 6,548,985 to Benavides et al. This patent is directed to an architecture for packaging surface micro-machined electro-microfluidic devices which uses two scales of packaging to bring fluid to the device scale (picoliters) from the macro-scale (microliters). The larger package includes a circuit board with embedded fluidic channels and standard fluidic connectors (e.g., fluidic printed wiring board). The embedded channels connect to the smaller package, an electro-microfluidic dual-inline package (EMDIP) that takes fluid to the microfluidic integrated circuit (MIC). The fluidic connection is made to the back of the MIC through Bosch-etched holes that take fluid to surface micro-machined channels on the front of the MIC. Electrical connection is made to bond pads on the front of the MIC.

U.S. Pat. No. 5,640,995 to Packard et al. discloses a miniature electro-fluidic module for receiving one or more fluids and for receiving an electrical connection. The module includes a substantially flat fluidic manifold layer for fluid distribution, a substantially flat electrical layer including an electrical circuit, and a substantially flat device layer including micro-machined devices, such as electrically actuated valves for modulating the flow of fluids. The electro-fluidic module may be incorporated in electro-fluidic system, such as a dialysate handling system. In this system, the electro-fluidic module is mounted on a fluidic fixture. The micro-machined devices are interfaced to electrical and fluidic interfaces on the fixture by providing electrical and fluidic interfaces between the module and the fixture.

Despite the advantages of such systems, further advancements in electro-fluidic interconnections may be required as device sizes continue to decrease.

SUMMARY OF THE INVENTION

In view of the foregoing background, it is therefore an object of the present invention to provide an electro-fluidic device with enhanced electro-fluidic interconnects and related methods.

This and other objects, features, and advantages in accordance with the present invention are provided by an electro-fluidic device which may include a substrate having at least one substrate fluid passageway therein, and at least one substrate electrical conductor carried by the substrate. Moreover, an external interface may be spaced from the substrate and include at least one interface electrical conductor. The electro-fluidic device may also include at least one electro-fluidic interconnect extending between the substrate and the external interface. More particularly, the at least one electro-fluidic interconnect may include an interconnect body having at least one interconnect fluid passageway extending therethrough and connected to the at least one substrate fluid passageway, and at least one interconnect electrical conductor carried by the interconnect body. The at least one interconnect electrical conductor may connect the at least one substrate electrical conductor and the at least one interface electrical connector.

By way of example, the interconnect body may have at least one sidewall, and the at least one interconnect electrical conductor may be enclosed within the at least one sidewall. The at least one interconnect electrical conductor may also be located on any surface of the interconnect body. The at least one interconnect electrical conductor may be a printed conductor, for example.

In addition, the interconnect body may include a low temperature co-fired ceramic (LTCC). Thus, for example, the interconnect body may be made using stacked LTCC tape layers, which allows conductors to be inserted between various layers during stacking to provide electrical conductors enclosed within the sidewall of the final interconnect body, and/or the electrical conductors can be printed thereon, as noted above. This advantageously allows a relatively large number of electrical conductors to be carried by the interconnect body, for example.

The interconnect body may have a substantially rectangular lateral cross-sectional shape, for example, although other shapes may be used as well. Additionally, the lateral cross-sectional area of the interconnect body may be less than about 5 $mm^2$, for example. The at least one interconnect fluid passageway may include a plurality of interconnect fluid passageways and, as noted above, the at least one interconnect electrical conductor may include a plurality thereof.

The electro-fluidic device may also include a microfluidic device carried by the substrate electrically connected to the at least one substrate electrical conductor and in fluid communication with the at least one substrate fluid passageway. By way of example, the microfluidic device may be a micro-rotary engine. Additionally, the electro-fluidic device may include an electronic device carried by the substrate electrically connected to the at least one substrate electrical conductor and in thermal communication with the at least one substrate fluid passageway.

A method aspect of the invention is for interconnecting a substrate and an external interface, such as those described briefly above. The method may include connecting at least one electro-fluidic interconnect between the substrate and the external interface, such as the one described briefly above, to provide the appropriate electrical and fluid interconnection therebetween.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternate embodiments. Moreover, certain figures or portions thereof may be enlarged for clarity of illustration.

Figure 1:
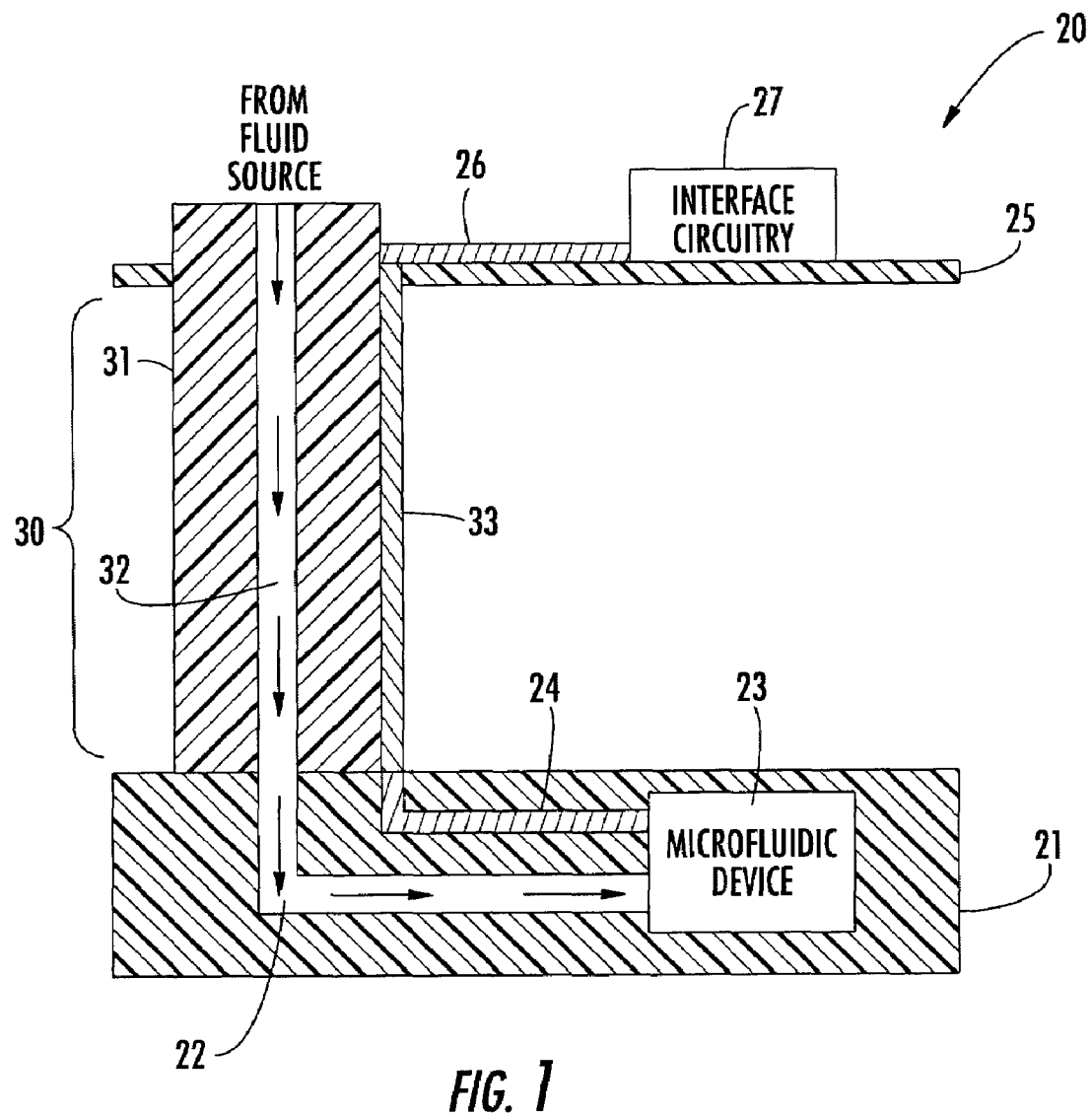
FIG. 1 is a side view of an electro-fluidic device in accordance with the present invention.

Referring initially to FIG. 1, an electro-fluidic device 20 in accordance with the invention illustratively includes a substrate 21 having one or more substrate fluid passageways 22 therein. The substrate 21 may be made from a variety of materials, such as semiconductors (e.g., silicon), ceramics (e.g., low-temperature co-fired ceramic (LTCC)), etc. The substrate passageway 22 may be formed using known techniques appropriate for the particular substrate 21 material. One method for forming passageways in LTCC structures will be discussed further below with reference to FIG. 3.

In the illustrated embodiment, a microfluidic device 23 is illustratively mounted within the substrate 21 and is in fluid communication with the substrate fluid passageway 22. By way of example, the microfluidic device 23 may be a MEMS device, such as a micro-rotary engine, for example, which receives fuel via the substrate fluid passageway 22. This particular application will be described in further detail in the example provided below. Numerous other microfluidic devices may also be used, such as microfluidic catalytic fuel cells which use the substrate fluid passageway 22 as a fuel feed, or other MEMS devices such as actuators, fluid sensors, valves, etc. It should be noted that the microfluidic device 23 need not be enclosed within the substrate 21. That is, in some embodiments the microfluidic device 23 may be mounted externally on the substrate 21, as will be appreciated by those skilled in the art.

One or more substrate electrical conductors 24 are also carried by the substrate 21 and are connected to the microfluidic device 23. The substrate electrical conductors 24 are used to provide electrical interconnections to the microfluidic device 23, such as for control and/or feedback signals, etc., as will be appreciated by those skilled in the art. Here again, the substrate electrical conductors 24 may be on the exterior of the substrate 21 as well.

The electro-fluidic device 20 also illustratively includes an external interface 25 that is spaced from the substrate 21 and includes one or more interface electrical conductors 26. The external interface 25 allows the above-noted control and feedback signals to be communicated to/from the microfluidic device 23. In the illustrated example, the external interface 25 has interface circuitry 27 thereon connected to the interface electrical conductor 26 to facilitate signal communications.

Of course, in some embodiments, the external interface 25 may simply be a signal routing board, for example, and not have any interface circuitry 27 thereon. On the other hand, in other embodiments the external interface 25 may include all of the necessary circuitry required for communicating with the microfluidic device 23 (e.g., a microprocessor, etc.), so that the electro-fluidic device 20 is essentially self-contained (although it may still communicate with other systems or devices). By way of example, the external interface 25 may be a printed circuit board (PCB) or a multi-chip module (MCM). Of course, other suitable interfaces known to those skilled in the art which are appropriate for a given application may also be used. The conductors 24, 26 may take various forms, such as printed conductors (i.e., traces that are screen printed with conductive ink), wires, etc., or combinations thereof as appropriate for a given application, as will be appreciated by those skilled in the art.

In accordance with the invention, the electro-fluidic device 20 also advantageously includes one or more electro-fluidic interconnects 30 extending between the substrate 21 and the external interface 25. More particularly, the electro-fluidic interconnect 30 illustratively includes an interconnect body 31 having one or more interconnect fluid passageways 32 extending therethrough and connected to the substrate fluid passageway 22. Moreover, the electro-fluidic interconnect 30 also includes one or more electrical conductors 33 carried by the interconnect body 31. The interconnect electrical conductor 33 connects the substrate electrical conductor 24 and the interface electrical connector 26, as shown.

Figure 2:
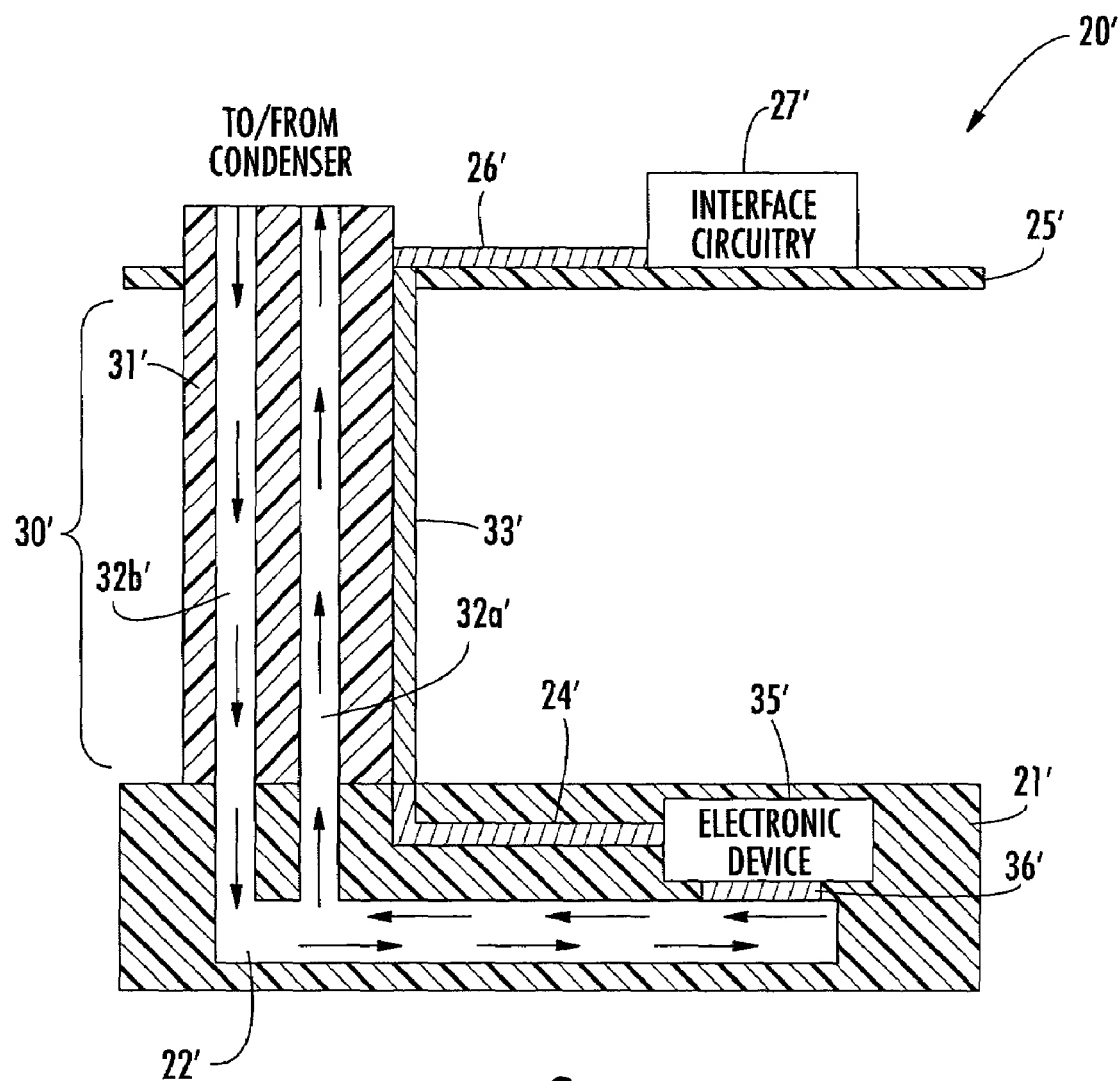
FIG. 2 is a side view of an alternate embodiment of the electro-fluidic device of FIG. 1.

Turning now additionally to FIG. 2, an alternate embodiment of electro-fluidic device 20' is now described. Here, instead of the microfluidic device 23, an electronic device 35' which generates a large amount of heat is carried by the substrate 21'. Here again, the electronic device 35' could be enclosed within the substrate 21', or mounted on the outside thereof, depending upon the given application. In the illustrated embodiment, the substrate fluid passageway 22' advantageously serves as a cooling fluid passageway which is in thermal communication with the electronic device 35' via a thermal conductor 36'. By way of example, the thermal conductor 26' may be a metal plug connected to the electronic device 35' (e.g., by brazing) which hermetically seals the substrate fluid passageway 22' and transfers heat from the electronic device to the passageway.

The thermal conductor 36' thus acts as an evaporator to evaporate cooling fluid in the substrate fluid passageway 22'. The interconnect body 31' includes two interconnect fluid passageways 32a', 32b' for transporting the evaporated cooling fluid to a condenser (not shown) and returning condensed cooling fluid therefrom, respectively. Examples of electronic devices 35' may include power metal oxide semiconductor field-effect transistors (MOSFETs), vertical-cavity surface emitting laser (VCSEL) devices, etc., which typically generate a significant amount of heat and have to be cooled to operate properly.

Figure 3:
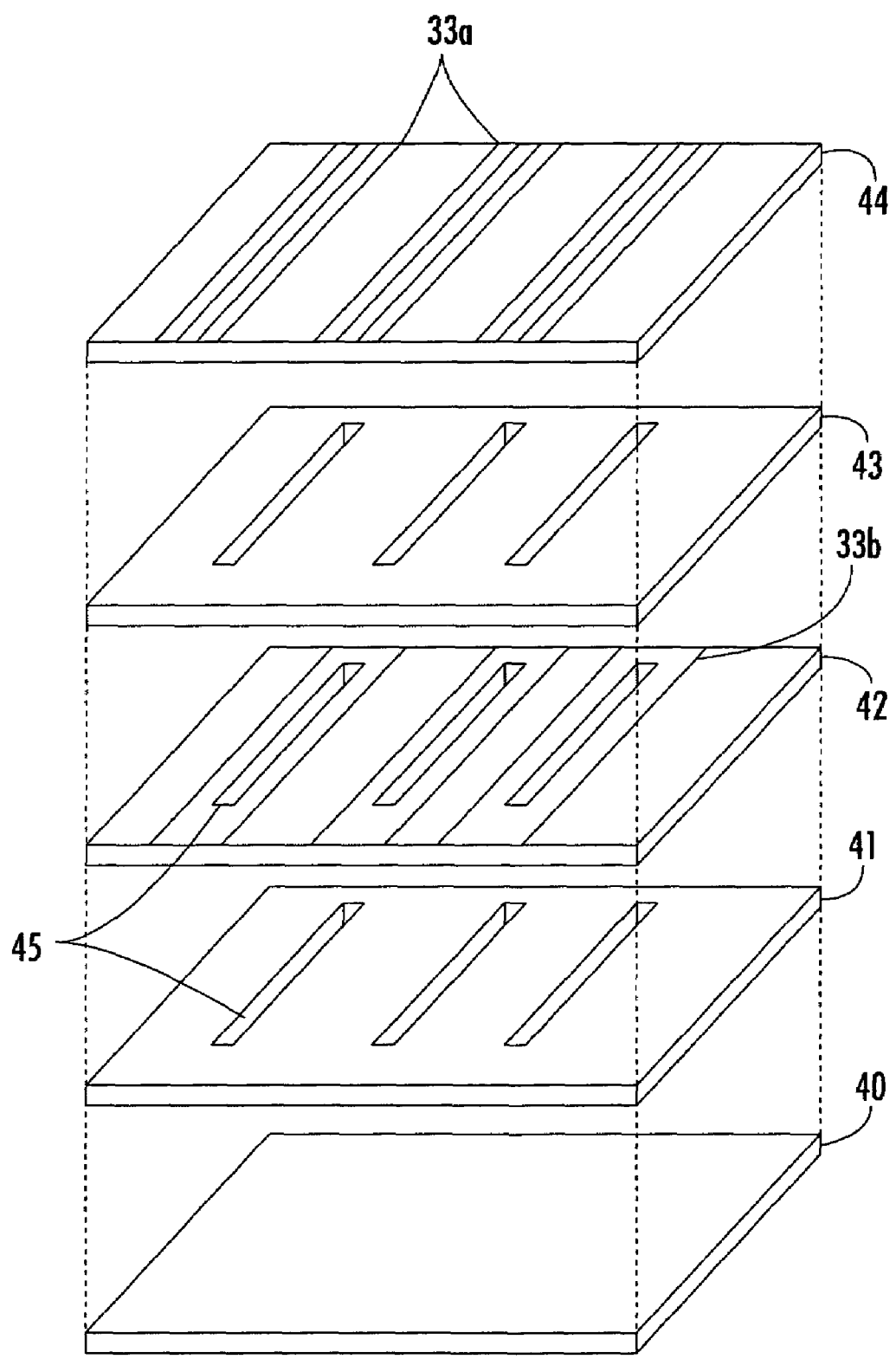
FIG. 3 is a perspective view illustrating a method of making electro-fluidic interconnects in accordance with the invention.

A method for making an electro-fluidic interface 30 in accordance with the invention will now be described with reference to FIGS. 3 and 4. In the illustrated example, the electro-fluidic interface 30 is formed using a plurality of LTCC tape layers 40–44. However, it should be noted that other suitable materials (e.g., liquid crystal polymer, etc.) and methods may also be used for making the electro-fluidic interface 30, as will be appreciated by those skilled in the art. More particularly, the intermediate tape layers 41–43 have holes 45 punched therein, and these tape layers are stacked on the bottom layer 40. The top layer 44, which has interconnect electric conductors 33a screen printed thereon, is then stacked on the intermediate layer 43. The intermediate tape layer 42 similarly has interconnect electrical conductors 33b printed thereon. The bottom layer 40 similarly has interconnect electric conductors printed on the bottom (not shown). It should also be noted that any configuration of electrical conductors that can be made in LTCC may also advantageously be fabricated into the electro-fluidic interface 30 (for example microstrip, stripline, coplanar waveguide, etc.).

Accordingly, once properly aligned and stacked together, corresponding holes 45 in the intermediate tape layer 41–43 define the interconnect passageways 32 noted above. The stacked layers are then laminated, which may be done using conventional laminating techniques known to those skilled in the art. It should be noted that in some instances it may be desirable to use inserts, e.g., wax inserts, in the holes 45 to help them retain their shape during the lamination process, as will be discussed further below.

Once the lamination process is complete, the resulting structure may be separated (e.g., using a diamond saw) to expose the ends of the interconnect passageways and/or form individual interconnect structures 30. For example, the stack illustrated in FIG. 3 could be separated to form three separate electro-fluidic interconnects 30 each having a single interconnect fluid passageway 32, or it could remain as is to provide a single interconnect having three interconnect fluid passageways. As will be appreciated by those of skill in the art, various numbers of interconnect fluid passageways 32 may be created using this process, and the sizes/geometries of the passageways may be varied as well.

Figure 4:
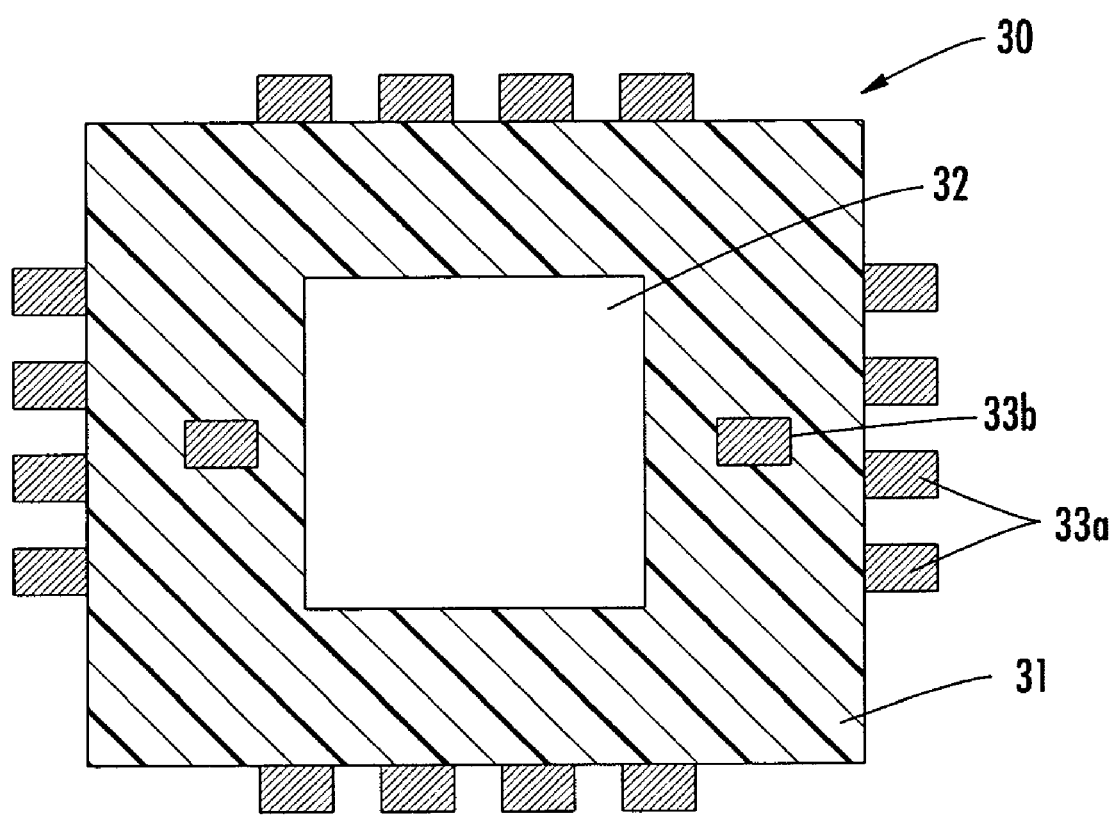
FIG. 4 is a lateral cross-sectional view of an electro-fluidic interconnect in accordance with the invention.

Taking the example where the laminated structure is divided into three separate electro-fluidic interconnects 30, a lateral cross-section of one such interconnect is shown in FIG. 4. As may be seen, the interconnect electrical conductors 33a (which are printed on the bottom and/or top tape layers 40, 44) are on the exterior of the interconnect body 31. Additional exterior interconnect conductors 33a may be printed on the laminated stack after separation, as also shown in FIG. 4. If desired, the interconnect electrical conductors 33a may be formed along the exterior length of the interconnect body 31, as illustratively shown, although they not need be in all embodiments.

On the other hand, the interconnect electrical conductors 33b printed on the intermediate tape layer 42 are enclosed within the sidewalls of the interconnect body 31. By placing the interconnect electrical conductors 33b within the sidewalls of the interconnect body 31, this advantageously allows a greater number of electrical connections to be made with the microfluidic device 23 (or electronic device 35').

The interconnect body 31 illustrated in FIG. 4 has a substantially rectangular lateral cross-sectional shape. Of course, it will be appreciated that other shapes may be used, if desired. While the interconnect body 31 may be made in numerous sizes depending upon the manufacturing process used, the above-described process has been used to produce interconnect bodies 31 having lateral cross-sectional areas of less than about 10 mm$^2$, and, more particularly, about 15,000 mils$^2$. Moreover, it has been demonstrated that thirty or more interconnect electrical conductors 33 may be carried by the interconnect body 31 within such a cross-sectional area.

The present invention will be further understood with reference to the following example thereof.

EXAMPLE

In a cooperative effort between the University of California Berkeley, Textron Systems, and Harris Corporation, assignee of the present application, a MEMS rotary engine power system (MEMS-REPS) is being developed to provide an autonomous, commercially viable, portable power system based on an integrated power generator and rotary internal combustion engine. It is anticipated that the engine will have an energy density of 2300 W-hr/kg with a continuous power output of 30 mW, which represents a 5–14× increase over commercial off-the-shelf (COTS) batteries (e.g., alkaline, lithium-ion and zinc-air). Designed to run on high-octane gasoline, it is estimated that the MEMS-REPS device may provide longer lifetimes than battery power (on the order of weeks/months), limited only by the fuel supply.

Figure 5:
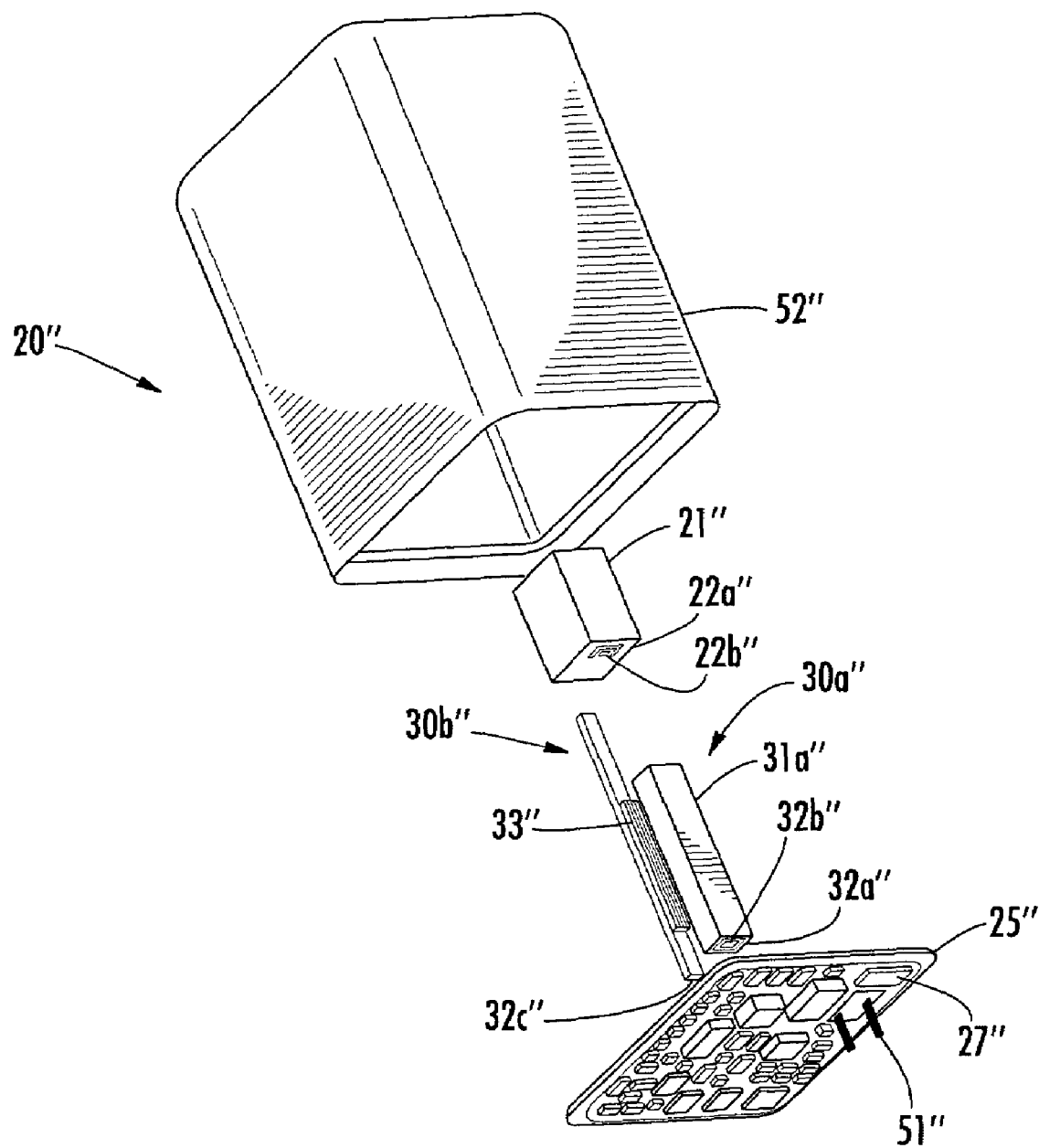
FIG. 5 is a perspective view of an electro-fluidic MEMS-REPS device in accordance with the present invention.

The MEMS-REPS package design is shown in FIG. 5. At the core is a silicon substrate 21" which houses the MEMS rotary engine and associated combustion chambers and electrical power generator (not shown). Control and power conditioning electronics 27" are mounted to an LTCC MCM 25" having external electrical connectors 51", and the system is packaged in a kovar or metallic shell 52". Electro-fluidic interconnect 30a" provides exhaust and air for combustion to the rotary engine via the interconnect fluid passageways 32a", 32b". The electro-fluidic interconnect 30b" provides a fuel feed to the rotary engine via the interconnect fluid passageway 32c", as well as electrical interconnections via the conductors 33". Additionally, conductors 33" (not shown) may also be carried by the interconnect body 31a".

As will be appreciated by those skilled in the art, the electro-fluidic interconnects 30a", 30b" not only have to provide adequate fluid and electrical interconnection, but they also need to provide appropriate thermal insulation to maintain high engine temperature and prevent heat from the engine to sink to the MCM 25" and surrounding package. Preliminary thermal and combustion analysis shows that the surface temperature of the silicon substrate 21" should be maintained around 400° C. to achieve combustion temperatures high enough to sustain operation of the engine. Using a target form factor of 17 cm$^3$ (1 inch$^3$), this translates to a thermal resistance of approximately 188° C./W. In addition, most of the heat escaping the system will likely travel through the electro-fluidic interconnects 30a", 30b", highlighting the critical importance of thermal management in this facet of the system.

For these reasons, LTCC provides a good match for the requirements of the MEMS-REPS electro-fluidic interconnects 30a", 30b". More particularly, LTCC provides the advantages of: 1) extremely low thermal conductivity; 2) high temperature stability; 3) high tolerance to hydrocarbons and elevated-temperature exhaust gases; 4) hermeticity; and 5) compatibility with MEMS packaging processes. While many ceramic and metal-oxide systems may share these characteristics with LTCC and may be used in accordance with the invention for various applications, LTCC was chosen for the MEMS-REPS application because of its advantages in accommodating multiple interconnect electrical conductors 33.

More particularly, it is anticipated that forty or more separate signal paths will be needed for the rotary engine and its various sensors, etc. For such a relatively large number of interconnect electrical conductors 33, LTCC advantageously provides a high-reliability electrical interconnect substrate, as well as desired thermal insulation and high-density characteristics.

To analyze the feasibility of using planar LTCC fabrication processes to build three-dimensional fluid tubes as described above with reference to FIG. 3, test coupons were fabricated integrating both embedded channels and high-density electrical interconnects. These tests indicated that LTCC will provide desired results for the MEMS-REPS electro-fluidic interconnects 30a″, 30b″ described above.

Various fabrication techniques were developed for making the MEMS-REPS LTCC electro-fluidic interconnects 30a″, 30b″. The most compliant process involves multiple lamination stages. In this process, the layer stack is divided into sub-sections based on cavity topologies. Each sub-section is subjected to a partial lamination prior to final lamination as a whole. This approach is attractive because no additional materials or processes are required, and it is best suited to open cavities and those with small planar areas with respect to depth. Most structures for the MEMS-REPS program were created with this method. However, many cavity structures (especially embedded ones) experience significant deformation during lamination and sagging during firing.

The use of removable latex inserts during lamination mitigates this effect for open cavities, but this technique generally cannot be used for embedded ones because the latex needs to be removed before firing. Instead, a process using granular wax to fill the cavities prior to lamination was used. This process allows the material to be fired along with the rest of the substrate. By designating the melting point of the wax and modifying the firing profile of the LTCC, the wax melts out and burns off between 100 and 500° C., far before the LTCC has sintered. Further details regarding the MEMS-REPS system may be found in an article by Smith et al. entitled "Microfluidics for Thermal Management: Applications, Fabrication, and Demonstration in LTCC," IMAPS: Ceramic Interconnect Technology, Technical Papers, Apr. 7, 2003, which is hereby incorporated herein in its entirety by reference. However, these additional processing steps are not necessary if the exact shape and size of the inner cavity are not critical.

A method aspect of the invention is for interconnecting a substrate 21 and an external interface 25, such as those described above. The method may include connecting at least one electro-fluidic interconnect 30 between the substrate 21 and the external interface 25, as also described above, to provide the appropriate electrical and fluid interconnection therebetween. Further method aspects of the invention will be readily apparent to those skilled in the art based upon the foregoing discussion and will therefore not be discussed further herein.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. An electro-fluidic device comprising:
a substrate having at least one substrate fluid passageway therein;
at least one substrate electrical conductor carried by said substrate;
an external interface spaced from said substrate and comprising at least one interface electrical conductor; and
at least one electro-fluidic interconnect extending between said substrate and said external interface and comprising
an interconnect body having at least one interconnect fluid passageway extending therethrough and connected to said at least one substrate fluid passageway, and
at least one interconnect electrical conductor carried by said interconnect body connecting said at least one substrate electrical conductor and said at least one interface electrical conductor.

2. The electro-fluidic device of claim 1 wherein said interconnect body comprises at least one sidewall, and wherein said at least one interconnect electrical conductor is enclosed within said at least one sidewall.

3. The electro-fluidic device of claim 1 wherein said at least one interconnect electrical conductor comprises a printed conductor.

4. The electro-fluidic device of claim 1 wherein said interconnect body comprises a low temperature co-fired ceramic (LTCC).

5. The electro-fluidic device of claim 1 wherein said interconnect body has a substantially rectangular lateral cross-sectional shape.

6. The electro-fluidic device of claim 1 wherein said interconnect body has a lateral cross-sectional area of less than about 10 mm$^2$.

7. The electro-fluidic device of claim 1 wherein the at least one interconnect fluid passageway comprises a plurality of interconnect fluid passageways.

8. The electro-fluidic device of claim 1 wherein said at least one interconnect electrical conductor comprises a plurality thereof.

9. The electro-fluidic device of claim 1 further comprising a microfluidic device carried by said substrate, electrically connected to said at least one substrate electrical conductor, and in fluid communication with the at least one substrate fluid passageway.

10. The electro-fluidic device of claim 9 wherein said microfluidic device comprises a micro-rotary engine.

11. The electro-fluidic device of claim 1 further comprising an electronic device carried by said substrate electrically connected to said at least one substrate electrical conductor and in thermal communication with the at least one substrate fluid passageway.

12. An electro-fluidic device comprising:
a substrate having at least one substrate fluid passageway therein;
a plurality of substrate electrical conductors carried by said substrate;

an external interface spaced from said substrate and comprising a plurality of interface electrical conductors;

at least one electro-fluidic interconnect extending between said substrate and said external interface and comprising a low temperature co-fired ceramic (LTCC) interconnect body having at least one interconnect fluid passageway extending therethrough and connected to said at least one substrate fluid passageway, and a plurality of interconnect electrical conductors carried by said interconnect body connecting said substrate electrical conductors and said interface electrical connectors; and a microfluidic device carried by said substrate, electrically connected to said substrate electrical conductors, and in fluid communication with the at least one substrate fluid passageway.

13. The electro-fluidic device of claim 12 wherein said interconnect body comprises at least one sidewall, and wherein at least one of said interconnect electrical conductors is enclosed within said at least one sidewall.

14. The electro-fluidic device of claim 12 wherein said interconnect electrical conductors comprise printed conductors.

15. The electro-fluidic device of claim 12 wherein said interconnect body has a substantially rectangular lateral cross-sectional shape.

16. The electro-fluidic device of claim 12 wherein said interconnect body has a lateral cross-sectional area of less than about 10 mm$^2$.

17. The electro-fluidic device of claim 12 wherein the at least one interconnect fluid passageway comprises a plurality of interconnect fluid passageways.

18. The electro-fluidic device of claim 12 wherein said at least one interconnect electrical conductor comprises a plurality thereof.

19. The electro-fluidic device of claim 12 wherein said microfluidic device comprises a micro-rotary engine.

20. A method for interconnecting a substrate having at least one substrate fluid passageway therein and at least one substrate electrical conductor carried thereby, and an external interface spaced from the substrate and comprising at least one interface electrical conductor, the method comprising:

connecting at least one electro-fluidic interconnect between the substrate and the external interface, the at least one electro-fluidic interconnect comprising an interconnect body having at least one interconnect fluid passageway extending therethrough to be connected to the at least one substrate fluid passageway, and at least one interconnect electrical conductor carried by the interconnect body for connecting the at least one substrate electrical conductor and the at least one interface electrical conductor.

21. The method of claim 20 wherein the interconnect body comprises at least one sidewall, and wherein the at least one interconnect electrical conductor is enclosed within the at least one sidewall.

22. The method of claim 20 wherein the at least one interconnect electrical conductor comprises a plurality of printed conductors.

23. The method of claim 20 wherein the interconnect body comprises a laminated stack of low temperature co-fired ceramic (LTCC) layers.

24. The method of claim 20 wherein the interconnect body has a lateral cross-sectional area of less than about 10 mm$^2$.

25. The method of claim 20 wherein the at least one interconnect fluid passageway comprises a plurality of interconnect fluid passageways.

* * * * *